(12) United States Patent
Yuan et al.

(10) Patent No.: US 8,438,448 B2
(45) Date of Patent: May 7, 2013

(54) DECODING METHOD AND DEVICE FOR LOW DENSITY GENERATOR MATRIX CODES

(75) Inventors: Zhifeng Yuan, Shenzhen (CN); Jun Xu, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 239 days.

(21) Appl. No.: 12/991,628

(22) PCT Filed: Oct. 14, 2008

(86) PCT No.: PCT/CN2008/072684
§ 371 (c)(1),
(2), (4) Date: Nov. 8, 2010

(87) PCT Pub. No.: WO2009/137973
PCT Pub. Date: Nov. 19, 2009

(65) Prior Publication Data
US 2011/0060960 A1    Mar. 10, 2011

(30) Foreign Application Priority Data
May 14, 2008   (CN) .......................... 2008 1 0096993

(51) Int. Cl.
*H03M 13/00* (2006.01)
(52) U.S. Cl.
USPC ............................ 714/752; 714/758; 714/780
(58) Field of Classification Search ................. 714/752, 714/758, 780, 786, 781
See application file for complete search history.

(56) References Cited

U.S. PATENT DOCUMENTS

| 7,395,484 | B2 | 7/2008 | Matsumoto |
| 7,530,002 | B2 * | 5/2009 | Lee et al. ....................... 714/758 |
| 7,721,184 | B2 * | 5/2010 | Luby et al. .................... 714/781 |
| 7,958,429 | B2 * | 6/2011 | Lin et al. ....................... 714/758 |
| 8,069,390 | B2 * | 11/2011 | Lin ............................... 714/758 |
| 2005/0246615 | A1 | 11/2005 | Matsumoto |
| 2006/0156183 | A1 | 7/2006 | Kim et al. |
| 2009/0265600 | A1 * | 10/2009 | Matsumoto et al. .......... 714/752 |

FOREIGN PATENT DOCUMENTS

| CN | 1666420 | 9/2005 |
| CN | 1666420 A | 9/2005 |
| CN | 1783730 | 6/2006 |
| CN | 1783730 A | 6/2006 |

(Continued)

OTHER PUBLICATIONS

International Search Report in international application No. PCT/CN2008/072684, mailed on Feb. 26, 2009.

(Continued)

*Primary Examiner* — Fritz Alphonse
(74) *Attorney, Agent, or Firm* — Hunton & Williams, LLP

(57) ABSTRACT

A decoding method for low density generator matrix codes is disclosed, which decodes a bit information sequence that is transmitted after encoding with LDGC, the method comprises: S1: filling L−K known bits in a received code word sequence R and deleting code word symbols erased by a channel in R, and getting $R_e$; S2: deleting rows corresponding to the code word symbols erased by a channel from a transposed matrix $G_{ldgct}$ of an LDGC generator matrix, and getting $G_e$; S3: obtaining $I_t$ according to relation $G_e \times I_t = R_e$; S4: obtaining $s_t$ according to relation $G_{ldgct}(0:L-1, 0:L-1) \times I_t = s_t$, and getting an original information sequence of K bits by deleting the filled L−K known bits from $s_t$. The present disclosure can significantly reduce the storage overhead of a decoder, accelerate the decoding speed, and allow LDGC to be more smartly used in high speed communication systems.

10 Claims, 6 Drawing Sheets

FOREIGN PATENT DOCUMENTS

| | | |
|---|---|---|
| CN | 101141131 | 3/2008 |
| CN | 101141131 A | 3/2008 |
| CN | 101272150 | 9/2008 |
| CN | 101272150 A | 9/2008 |
| EP | 1667328 A1 | 6/2006 |
| RU | 2006138012 A | 5/2008 |
| WO | 2006020484 A1 | 2/2006 |

OTHER PUBLICATIONS

English Translation of the Written Opinion of the International Search Authority in international application No. PCT/CN2008/072684, mailed on Feb. 26, 2009.

International Search Report for International Application No. PCT/CN2008/072684 mailed Feb. 26, 2009.

* cited by examiner

Fig. 1

$G_{struct}$    $G_{random}$ $G_{lgdct}$ (a)             (b)

DECODING METHOD AND DEVICE FOR LOW DENSITY GENERATOR MATRIX CODES

CROSS-REFERENCE TO RELATED APPLICATIONS

This patent application is a U.S. national phase application of International Patent Application No. PCT/CN2008/072684, filed Oct. 14, 2008, which claims priority to China Patent Application No. 200810096993.1, filed May 14, 2008, each of which is hereby incorporated by reference herein in its entirety.

TECHNICAL FIELD

The present disclosure relates to the field of data encoding and decoding, and particularly to a decoding method and device for low density generator matrix codes.

BACKGROUND

A purpose of channel encoding is to ensure reliable transmission of information, the complexity of implementation of a channel encoding scheme mainly lies at a decoding end, and a decoder is typically a critical part of the channel encoding scheme. A decoder can be either implemented using hardware, i.e. using hardware logic units to construct the decoder; or implemented using software, i.e. using a general processor (CPU) to implement the decoder through programs; a decoder can also be implemented using an implementation method combining software and hardware.

Low Density Generator Matrix Codes (LDGC) generally mean: their generator matrix is a sparse binary matrix (i.e. matrix elements are comprised of 0 and 1 alone) of Class I codes, including structured LDGC and non-structured LDGC such as Raptor codes, etc.

The LDGC is suitable for performing forward error correction (FEC) to an erasure channel. During a data transmission process, if a data packet received at a receiving end has any check error, an erroneous data segment is discarded, which is equivalent to performing erasing. LDGC can effectively countermine loss of data.

Also, LDGC is a kind of linear block code, all elements in its generator matrix (encoding matrix) come from a two element field (GF(2) field), i.e. the elements in the generator matrix are comprised of 0 and 1 alone; and its nonzero elements are typically sparse, i.e. the number of "1"s in the matrix only accounts for a very small percentage in the total number of elements in the matrix; moreover, LDGC is also a kind of system code, i.e. a first K bits of code words generated by encoding K-bit information bits by using an LDGC generator matrix are the same as the information bits. All calculations involved during the LDGC encoding/decoding process are calculations in the GF(2) field.

A generator matrix of structured LDGC also has other characteristics, and can be obtained by expanding and modifying a very small basic matrix; in particular, a square matrix to which its first L rows correspond is generally an upper triangular or lower triangular matrix. While a generator matrix of LDGC that do not have any structured feature such as Raptor codes is a random binary matrix. Gldgc will be used below for collectively indicating an LDGC generator matrix, when it is necessary to indicate LDGC generator matrices separately, $G_{struct}$ will be used for indicating a transposition of a generator matrix of structured LDGC, $G_{random}$ will be used for indicating a transposition of a generator matrix of LDGC that do not have any structured feature (the matrix can be referred to as a non-structured LDGC generator matrix), and in particular $G_{random}$ will include a generator matrix of Raptor codes.

In the following statements, any "vector" or "matrix" with a subscript of a small letter t will all indicate a transposition of an original "vector" or "matrix", such vector or matrix and its transposition look exactly the same in their contents, and sometimes can indicate the same object. For example, $G_{ldgct}$ is defined as a transposition of $G_{ldgc}$, $I_t$ as a transposition of I, and $R_t$ as a transposition of R, because either I or R is a row vector, herein both $I_t$ and $R_t$ are column vectors; in the following, $G_{struct}$ and $G_{random}$ will be used respectively to indicate their separate generator matrix $G_{ldgct}$ after transposition.

Figure 1:
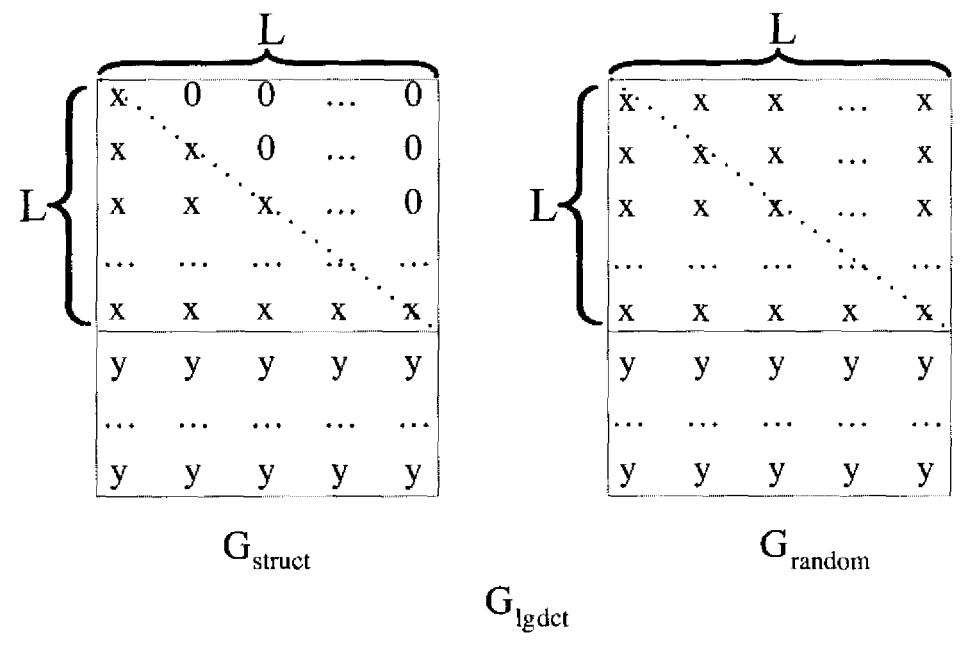

FIG. 1 is a schematic illustration of $G_{ldgct}$, which is an LDGC generator matrix after transposition. As shown in FIG. 1a, a square matrix to which a first L rows in a structured LDGC generator matrix $G_{struct}$ correspond is generally an upper triangular or lower triangular matrix. As shown in FIG. 1b, a square matrix to which a first L rows of Raptor codes correspond is a random matrix, which does not have the characteristics of an upper triangular or lower triangular matrix. Wherein x and y in the figure may be 0.

The encoding with LDGC involves first obtaining intermediate variables by using a corresponding relationship between information bits (i.e. data to be sent) and intermediate variables in system codes, and then obtaining after-encoding code words by multiplying the intermediate variables with a generator matrix. Specifically speaking, an encoding process involves first generating a sequence s of L bits by filling d=L−K known bits in an original information sequence m of K bits, then obtaining an intermediate variable sequence I of L bits by solving a system of equations according to the relation of the system of equations: $I \times G_{ldgc}(0:L-1, 0:L-1)=s$, then obtaining a code word sequence $C'_{ldgc}$ of N+d bits (containing d filled bits) by multiplying the intermediate variables with a generator matrix, i.e. $I \times G_{ldgc}(0:L-1, 0:N+d-1)$, the d filled bits in $C'_{ldgc}$ do not need to be transmitted, therefore what is really transmitted is a code word sequence $C_{ldgc}$ of N bits. After $C_{ldgc}$ passed through a channel (may be erased), a code word sequence received at a receiving end is R. Wherein s is a vector of 1×L; I is a vector of 1×L; R is a vector of 1×N, and its transposition $R_t$ is a vector of N×1; $G_{ldgc}(0:L-1, 0:L-1)$ is an L×L square matrix, which is generally an upper triangular or lower triangular matrix, and $G_{ldgc}(0:L-1, 0:N+d-1)$ is an L×(N+d) matrix. For the detailed process of encoding, please refer to the patent "An encoding method and device, a decoding method and device for low density generator matrix code".

FIG. 2 is a flowchart of a decoding method for low density generator matrix codes. As shown in FIG. 2, the decoding process includes the following steps:

201: obtaining $R_e$ by filling a known bit sequence of the length of d=L−K in the corresponding positions of a received code word sequence $R_t$, such as 1, 1, ..., 1, and by deleting code word symbols erased by a channel;

wherein K is the length of original information bits, and L is the encoded length of the original information bits after filling.

202: obtaining an erasure generator matrix $G_e$ by performing row erasing (deleting) processing to $G_{ldgct}$ according to how the received code word sequence $R_t$ has been erased.

FIG. 3 is a schematic illustration of performing erasing processing to the generator matrix according to how the received code word sequence $R_t$ has been erased. As shown in FIG. 3, the first L rows of the generator matrix $G_e$ after erasing processing no longer represent a lower triangular square matrix.

Assuming that $X_T$ symbols: $\{r_i, r_j, \ldots, r_p \ldots r_x\}$ in $R=(r_0, r_1, \ldots r_{N+d-1})^T$ after filling a known bit sequence has been erased by a channel; wherein $X_L$ symbols $\{r_i, r_j, \ldots, r_p\}$ in the first L symbols have been erased by a channel; then $Xset=\{i, j, \ldots, p, \ldots, x\}$; $Xset_L=\{i, j, \ldots p\}$. $G_e$ is simply obtained by erasing the $\{i, j, \ldots, p, \ldots, x\}$-th rows in $G_{ldgct}$ accordingly, and now because several rows have been erased, the matrix in $G_e$ is no longer exactly diagonalized, as shown in FIG. 3(c).

203: obtaining an intermediate variable $I_t$ by solving a system of equations $G_e \times I_t = R_e$;

204: obtaining $s_t$ according to the relation of the system of equations $G_{ldgct}(0:L-1,0:L-1) \times I_t = s_t$, and obtaining an original information sequence m of K bits by deleting the filled d known bits from $s_t$, thereby completing LDGC decoding.

During the above-mentioned decoding process, the most critical step is obtaining the intermediate variable $I_t$, and this would typically require solving a large scale system of binary linear equations. As far as engineering is concerned, methods such as Gauss elimination or iteration can be used for solving a system of linear equations; according to the characteristics of LDGC, the Gauss elimination method is more suitable for LDGC decoding. Therefore, the speed of the Gauss elimination process will directly affect the speed of LDGC decoding.

During the process of obtaining the intermediate variable $I_t$ according to the relation of a system of equations $G_{ldgct}(0:N+d-1,0:L-1) \times I_t = R_t$ ($G_{ldgct}$ is written as $G_e$ and $R_t$ is written as $R_e$ when there is channel erasure, and the above-mentioned relation of a system of equations is $G_e \times I_t = R_e$), the ongoing Gauss elimination has to perform three kinds of elementary transformations to $G_{ldgct}$ (written as $G_e$ when there is channel erasure), i.e. "row permutation, row addition and column permutation". According to the principles of linear algebra, in order to ensure the correctness of the system of equations, while performing elementary transformation to $G_{ldgct}$ ($G_e$), it is necessary to perform the following corresponding processing to $I_t$ and $R_t$ (or $R_e$ when there is channel erasure):

1) row permutation, if the i-th row and the j-th row of $G_{ldgct}$ ($G_e$) are permuted, the i-th bit and the j-th bit of $R_t$ ($R_e$) need to be permuted;

2) row addition, if the i-th row and the j-th row of $G_{ldgct}$ ($G_e$) are added, the i-th bit and the j-th bit of $R_t$ ($R_e$) need to be added (addition modulo 2);

3) column permutation, if the i-th column and the j-th column of $G_{ldgct}$ ($G_e$) are permuted, the i-th bit and the j-th bit of $I_t$ need to be permuted.

Because the final result required is to get $I_t$, while the elements in $I_t$ have been permuted correspondingly during column permutation of $G_{ldgct}$ ($G_e$), it is necessary to record how the $I_t$ has been permuted to make it easier for the subsequent inverse permutation process. As far as engineering is concerned, how the $I_t$ has been permuted can be recorded through an array. However, $R_t$ is not the data ultimately desired, so it can be processed directly, and it is not necessary to record how it has been processed.

Because these transformation relationships are strictly corresponding to each other, and the complexity of Gauss elimination is mainly reflected in the processing of $G_{ldgct}$ ($G_e$), for easy descriptions below, for any elementary transformation against $G_{ldgct}$ ($G_e$), the corresponding processing to $I_t$ and $R_t$ ($R_e$) has to be performed in strict accordance with the above-mentioned three situations. In order to focus on key points, the description of processing to $I_t$ and $R_t$ ($R_e$) may be simplified below sometimes.

Generally, the complexity (amount of calculation) in the implementation of Gauss elimination is mainly reflected in the "row addition" operation of the matrix. Because all elements of $G_{ldgct}$ come from the GF(2) field, the addition operation of two rows in $G_{ldgct}$ ($G_e$) is the "addition modulo 2" operation, for example, row_i, which is the contents of the i-th row, is: (1,0,0,0,0,1,0,1);

row_j, which is the contents of the j-th row, is: (1,1,0,0,0,1,1,1);

If an operation that uses row_i to eliminate row_j happens during Gauss elimination process, this is equivalent to:

row_j=row_i+row_j=(1,0,0,0,0,1,0,1)+(1,1,0,0,0,1,1,1)=(0,1,0,0,0,0,1,0);

herein "+" means addition (addition modulo 2) in the GF(2) field;

It is seen from the above-example that because all elements in $G_{ldgct}$ come from the GF(2) field, that is the value of an element can only be either 0 or 1, if these 0 and 1 elements are stored directly, that is each bit element occupies one storage unit or occupies one processor word (which is generally 32 bits), when the code length is large, $G_{ldgct}$ ($G_e$) would require a very big storage space; moreover, the row addition operation is very time-consuming because it has to perform addition modulo 2 to each element, respectively.

SUMMARY

The technical problem that the present disclosure intends to resolve is providing a decoding method and device for low density generator matrix codes, which can overcome disadvantages of the prior art, reduce storage space occupied by the LDGC generator matrix, and increase operation speed.

In order to solve the above-mentioned problem, the present disclosure provides a decoding method for low density generator matrix codes, which decodes received a bit information sequence that is transmitted after encoding with LDGC, and the method comprises:

S1: filling L−K known bits in a received code word sequence R and deleting code word symbols erased by a channel in R, and getting $R_e$;

S2: deleting rows corresponding to the code word symbols erased by a channel from a transposed matrix $G_{ldgct}$ of an LDGC generator matrix, and getting $G_e$; wherein using WNum processing words to sequentially store all or part of same-position matrix elements of each row in $G_e$, and each processing word is used for storing WWid matrix elements of $G_e$;

S3: obtaining $I_t$ according to relation $G_e \times I_t = R_e$;

S4: obtaining $s_t$ according to relation $G_{ldgct}(0:L-1,0:L-1) \times I_t = s_t$, and getting an original information sequence of K bits by deleting the filled L−K known bits from $s_t$;

the $G_{ldgct}$ is a GF(2) field matrix of N+L−K rows and L columns, WWid is the word width of the processing word, WNum=ceil(P/WWid), and P is the number of matrix elements of each row in $G_e$ that are stored by using one bit of the processing word.

Moreover, in step S3, $I_t$ may be obtained by using Gauss elimination method; and during the Gauss elimination process, for the matrix elements of each row in $G_e$ that are stored by using one bit of the processing word, row addition of corresponding rows may be accomplished by performing XOR operation to the processing words corresponding to two rows in $G_e$.

Moreover, a square matrix corresponding to the first L rows in $G_{ldgct}$ may be a lower triangular matrix;

step S3 may include the following substeps:

S31: generating $$G_a = \begin{bmatrix} A & C \\ D & B \end{bmatrix}$$

by performing column permutation to $G_e$, wherein A is an M-order lower triangular matrix, and recording corresponding relationship of column permutation between $G_e$ and $G_a$;

S32: obtaining $I_t'$ according to relation $G_a \times I_t' = R_e$, and getting $I_t$ by performing inverse permutation to $I_t'$ according to the corresponding relationship of column permutation;

wherein P is column number of matrices C and B, the processing words are used for sequentially storing all matrix elements of each row in C and B, and each bit of each processing word is used for sequentially storing WWid matrix elements of C and B.

Moreover, $M=L-X_L$, where $X_L$ is the number of bits erased by a channel in the first L code word symbols of R; and $P=X_L$.

Moreover, assuming that $Xset_L$ is a set of serial numbers of erased code word symbols in the first L code word symbols of R after filling L–K known bits, and the number of serial numbers in the set is $X_L$;

in step S31, columns of $G_e$ whose column serial numbers fall within $Xset_L$ are moved to the rightmost side of $G_e$, and subsequent columns whose column serial numbers do not fall within $Xset_L$ are sequentially filled in vacated positions of corresponding columns, and $G_a$ is obtained.

The present disclosure also provides a decoding device for low density generator matrix codes, which comprises: a filling and erasing unit, a Gauss elimination unit, and an information sequence generating unit, wherein the filling and erasing unit, is used for generating and outputting $R_e$ by filling L–K known bits in a received code word sequence R and by deleting code word symbols erased by a channel; and for generating and outputting $G_e$ by deleting rows corresponding to the code word symbols erased by a channel from a transposed matrix $G_{ldgct}$ of an LDGC generator matrix; wherein WNum processing words are used for sequentially storing all or part of same-position matrix elements of each row in $G_e$, and each processing word stores WWid matrix elements of $G_e$;

the Gauss elimination unit, is used for obtaining and outputting $I_t$ by performing Gauss elimination to $G_e$ according to relation $G_e \times I_t = R_e$;

the information sequence generating unit, is used for receiving the $I_t$ outputted by the Gauss elimination unit; obtaining $s_t$ according to relation $G_{ldgct}(0{:}L-1, 0{:}L-1) \times I_t = s_t$, and outputting an original information sequence of K bits after deleting L–K known bits from $s_t$;

the $G_{ldgct}$ is a GF(2) field matrix of N+L–K rows and L columns, WWid is the word width of the processing word, WNum=ceil(P/WWid), and P is the number of matrix elements of each row in $G_e$ that are stored by using one bit of the processing word.

Moreover, the Gauss elimination unit may obtain the $I_t$ by using Gauss elimination method; and during the Gauss elimination process, for the matrix elements of each row in $G_e$ that are stored by using one bit of the processing word, may accomplish row addition of corresponding rows by performing XOR operation to the processing words corresponding to two rows in $G_e$.

Moreover, a square matrix corresponding to the first L rows in $G_{ldgct}$ may be a lower triangular matrix;

the device may further comprise a column permutation unit, which is used for generating $$G_a = \begin{bmatrix} A & C \\ D & B \end{bmatrix}$$

by performing column permutation to $G_e$ outputted by the filling and erasing unit, wherein A is an M-order lower triangular matrix, and for outputting information on corresponding relationship of column permutation between $G_e$ and $G_a$;

the Gauss elimination unit may obtain $I_t'$ according to relation $G_a \times I_t' = R_e$, and may obtain and output $I_t$ by performing inverse permutation to $I_t'$ according to the information on the corresponding relationship of column permutation outputted by the column permutation unit;

wherein, P is column number of matrices C and B, the processing words are used for sequentially storing all matrix elements of each row in C and B, and each bit of each processing word is used for sequentially storing WWid matrix elements of C and B.

Moreover, $M=L-X_L$, where $X_L$ is the number of bits erased by a channel in the first L code word symbols of R; and $P=X_L$.

Moreover, assuming that $Xset_L$ may be a set of serial numbers of erased code word symbols in the first L code word symbols of R after filling L–K known bits, and the number of serial numbers in the set is $X_L$;

the column permutation unit moves columns of $G_e$ whose column serial numbers fall within $Xset_L$ to the rightmost side of $G_e$, and sequentially fills subsequent columns whose column serial numbers do not fall within $Xset_L$ in vacated positions of corresponding columns, and obtains $G_a$.

The LDGC decoding method of the present disclosure can fully use the characteristics of the LDGC generator matrix and the characteristics of the processor in its ability to process multiple bits in parallel, and utilize one "word" (referred to as a processing word) of the processor to store and represent elements whose number is "processor word width" in the decoding LDGC generator matrix; compared to those storage structures and data representation methods in which the elements of an LDGC generator matrix are directly stored, the present disclosure can significantly reduce the storage overhead of a decoder, accelerate the decoding speed, and allow LDGC to be more smartly used in high speed communication systems.

BRIEF DESCRIPTION OF THE DRAWINGS

FIG. 1 is a schematic illustration of $G_{ldgct}$ which is an LDGC generator matrix after transposition;

DETAILED DESCRIPTION

It is known from the above that because the matrix elements of the LDGC generator matrix (including $G_{struct}$ and $G_{random}$) are comprised of 0 and 1 alone, and the row addition operation involved in Gauss elimination is addition modulo 2, it is practical to use only one bit to store and represent a matrix element and use XOR (i.e. bitwise XOR) to replace addition modulo 2 of each matrix element, thereby quickly implementing row addition operations of the LDGC generator matrix.

For example, representing row_i, which is the contents of the i-th row as: 10000101;

representing row_j, which is the contents of the j-th row as: 11000111;

the addition of the contents of the i-th row and that of the j-th row can be equivalent to:

$$\text{row}\_j = \text{row}\_i \oplus \text{row}\_j = 10000101 \oplus 011000111 = 01000010;$$

where the "$\oplus$" mentioned above means XOR operation.

The present disclosure is described in detail below according to the attached drawings and embodiments; it should be noted that the present disclosure only addresses the decoder implementation method based on software or a combination of software and hardware.

Figure 2:
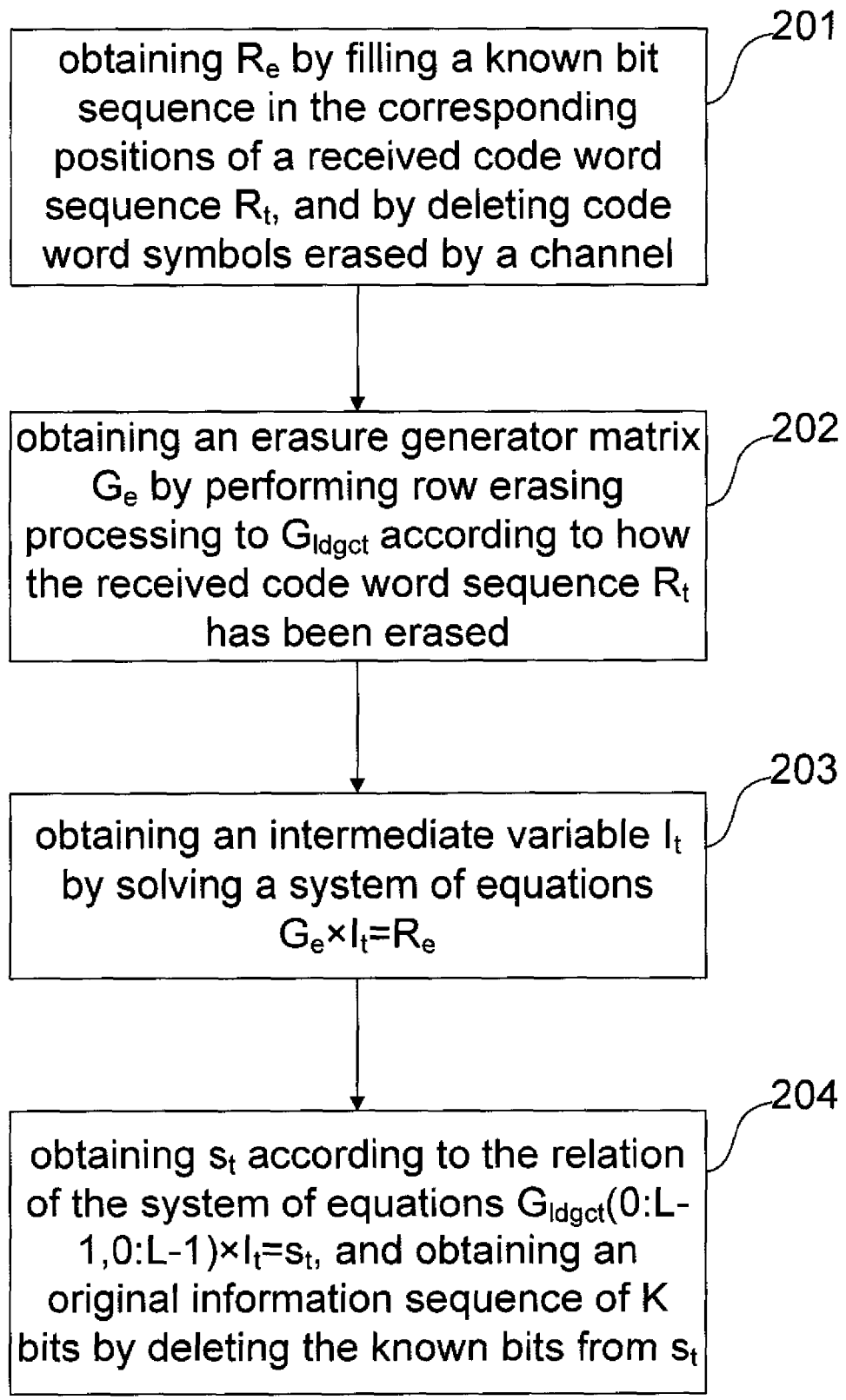
FIG. 2 is a flowchart of a decoding method for low density generator matrix codes.
Figure 3:
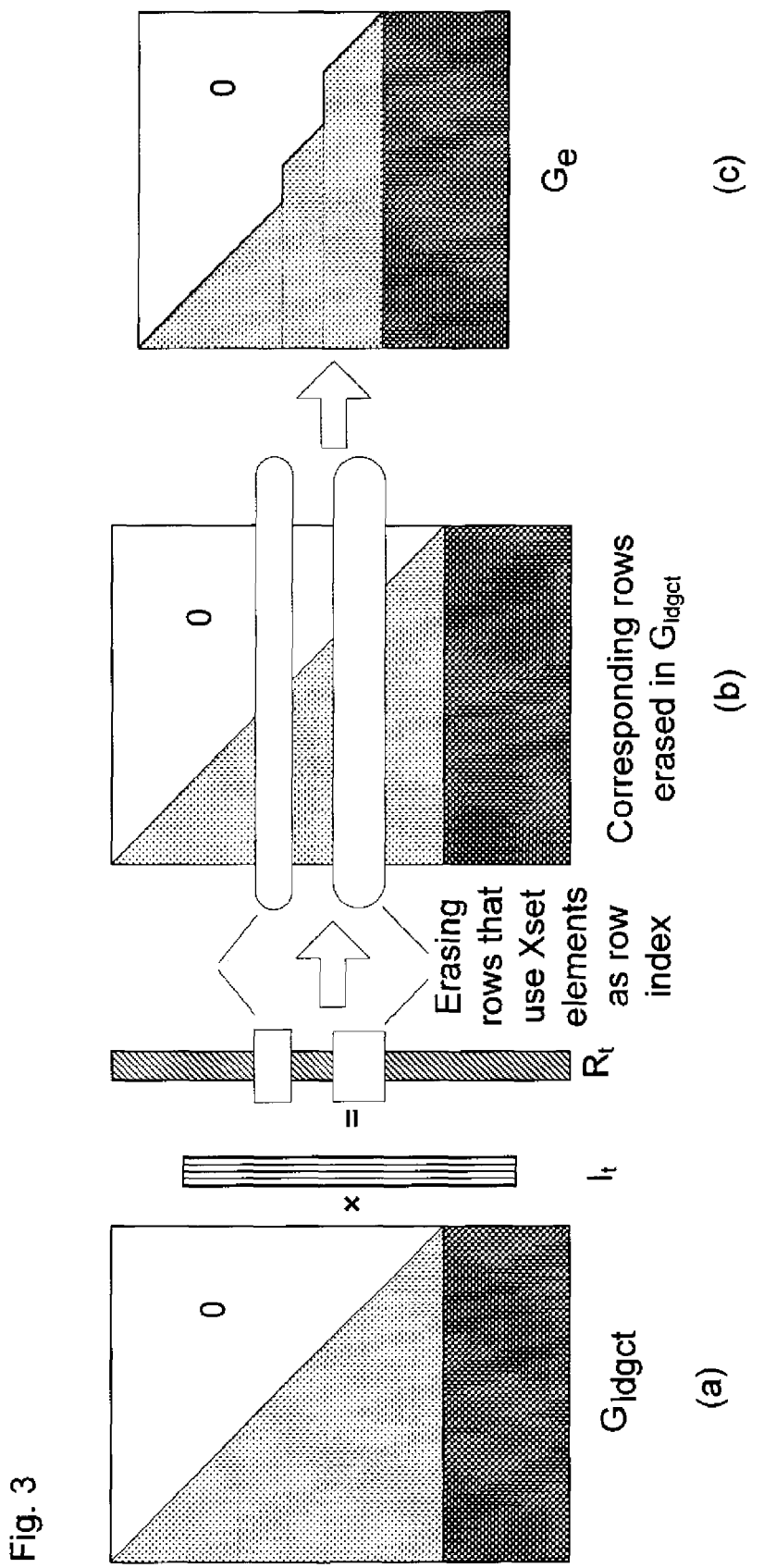
FIG. 3 is a schematic illustration of performing erasing processing to the generator matrix according to how the received code word sequence $R_t$ has been erased.
Figure 4:
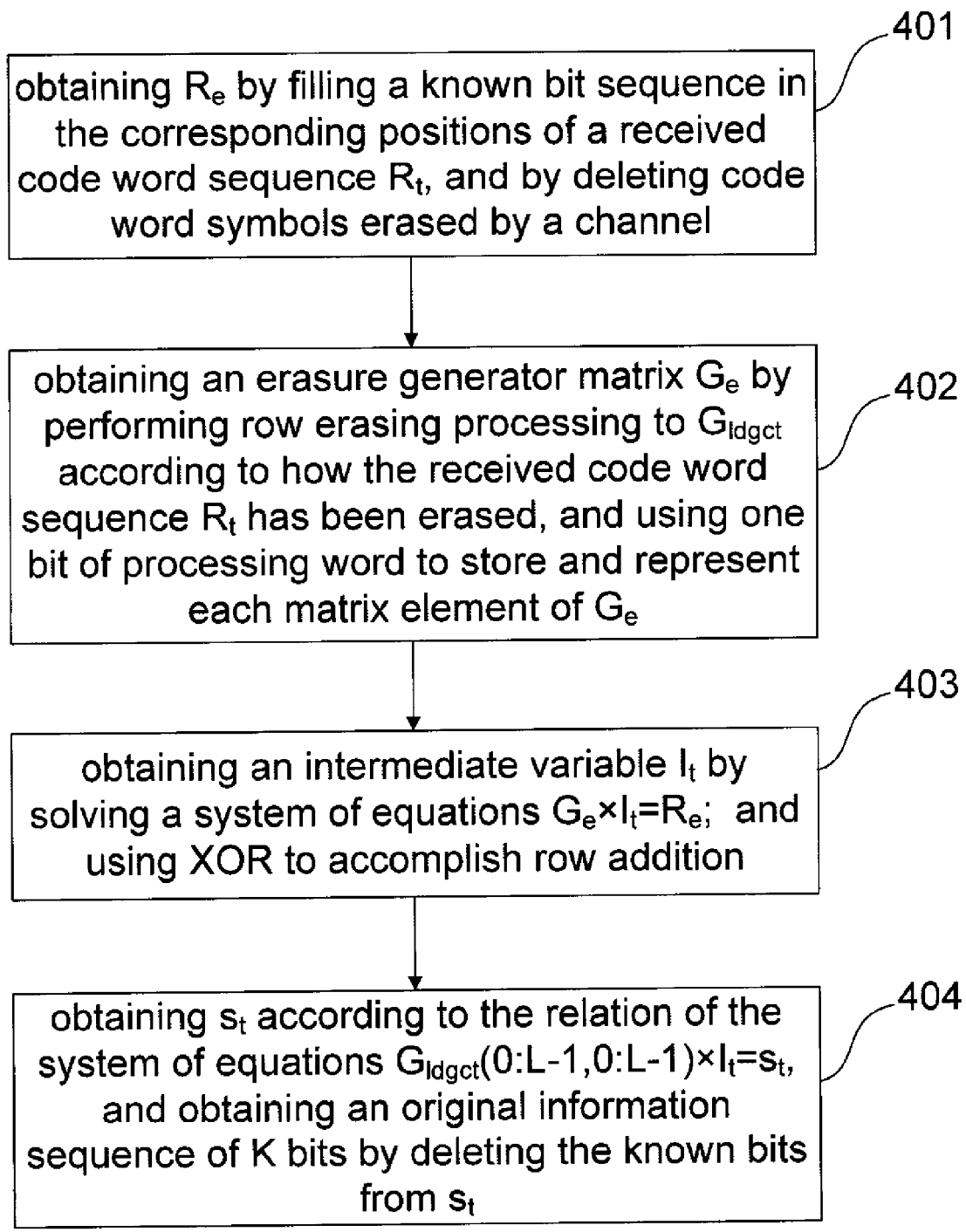
FIG. 4 is a flowchart of a decoding method for low density generator matrix codes according to the first embodiment of the present disclosure.

FIG. 4 is a flowchart of a decoding method for low density generator matrix codes according to the first embodiment of the present disclosure; this embodiment addresses a general purpose decoding method for structured and non-structured LDGC generator matrices ($G_{struct}$ and $G_{random}$). As shown in FIG. 4, the method includes the following steps:

401: obtaining $R_e$ by filling a known bit sequence of the length of d=L−K in the corresponding positions of a received code word sequence $R_t$, and by deleting code word symbols erased by a channel;

wherein K is the length of original information bits, and L is the encoded length of the original information bits after filling.

Assuming that $X_T$ symbols: $\{r_i, r_j, \ldots, r_p \ldots r_x\}$ in $R_t = (r_0, r_1, \ldots, r_{N+d-1})^T$ after filling a known bit sequence has been erased by a channel; wherein $X_L$ symbols $\{r_i, r_j, \ldots, r_p\}$ in the first L symbols have been erased by a channel; then Xset=$\{i, j, \ldots, p, \ldots, x\}$; $Xset_L = \{i, j, \ldots p\}$.

402: obtaining an erasure generator matrix $G_e$ by performing row erasing (deleting) processing to $G_{ldgct}$ according to how the received code word sequence $R_t$ has been erased; wherein each row of $G_e$ is represented by using WNum processor words (referred to as processing word), of course, each row of $G_{ldgct}$ can also be represented by using WNum processor words;

assuming Xset=$\{i, j, \ldots, p, \ldots, x\}$; $Xset_L = \{i, j, \ldots p\}$, obtaining $G_e$ by erasing the $\{i, j, \ldots, p, \ldots, x\}$-th rows in $G_{ldgct}$ accordingly.

Because each row of $G_e(G_{ldgct})$ contains L elements, WNum=ceil(L/WWid); WWid is the processor word width (which generally is 8, 16, 32, 64, in the unit of bit); i.e. using one processing word to sequentially store and represent WWid consecutive elements in $G_e$ ($G_{ldgct}$);

when L is not an integral multiple of WWid, the last processing word of each row contains the last mod(L,WWid) elements of that row, and the rest Z=WWid−mod(L,WWid) bits of that processing word can be cleared;

the ceil means rounding-up operation, and mod means modulo operation.

Ultimately, $G_e$ ($G_{ldgct}$) can be represented by using a two-dimensional array, and each element in the two-dimensional array is a processing word. The total number of elements of the two-dimensional array is: (N+d−$X_T$)×WNum; where $X_T$ is the number of rows erased. It is therefore known that the above-mentioned matrix representation method of the present disclosure can be used for saving a lot of storage space.

For example, when the processor word width WWid=32, each row of $G_e$ ($G_{ldgct}$) contains L=2000 elements, therefore ceil(2000/32)=63 processing words are needed to represent each row of $G_e$ ($G_{ldgct}$); because 2000 is not an integral multiple of 32, mod(2000,32)=16, the last processing word only has 16 significant bits, the rest 32−16=16 bits of the processing word are insignificant, and they can be cleared.

403: obtaining an intermediate variable $I_t$ by solving a system of equations $G_e \times I_t = R_e$;

during the process of obtaining the intermediate variable $I_t$ by using the Gauss elimination method, the "row addition" operation involved is accomplished by using the XOR instructions of the processor; therefore a complete row addition operation can be replaced by an XOR operation of WNum processing words, which is equivalent to perform row addition operation in parallel with a degree of parallelism of WWid, thereby dramatically increasing the operation speed of "row addition" operation.

404: obtaining $s_t$ according to the relation of the system of equations $G_{ldgct}(0:L-1,0:L-1) \times I_t = s_t$, and obtaining an original information sequence m of K bits by deleting the filled d known bits from $s_t$, thereby completing LDGC decoding.

Figure 5:
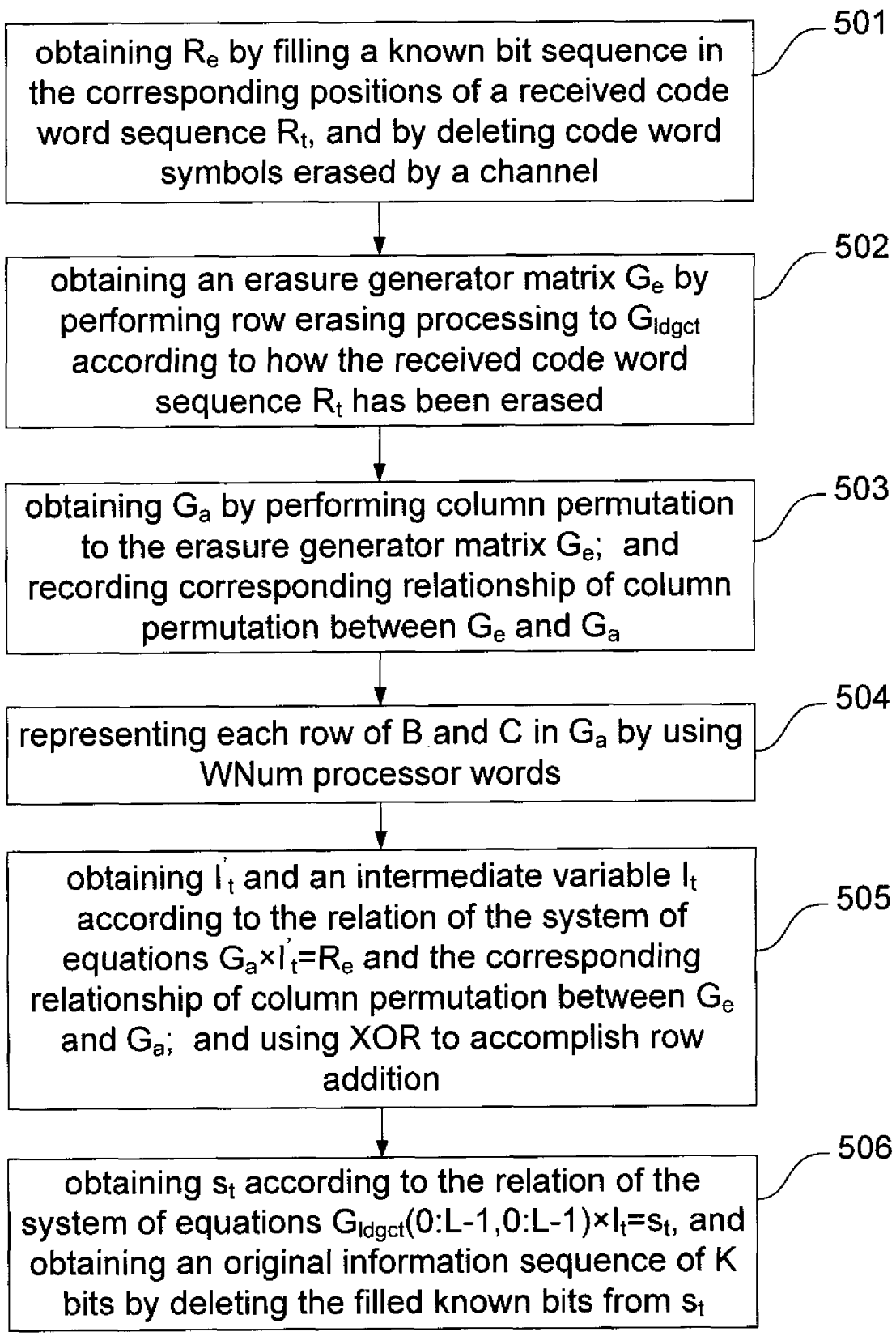
FIG. 5 is a flowchart of a decoding method for low density generator matrix codes according to the second embodiment of the present disclosure.

FIG. 5 is a flowchart of a decoding method for low density generator matrix codes according to the second embodiment of the present disclosure; this embodiment is a decoding method for a structured LDGC generator matrix ($G_{struct}$), and can use processing words alone to store part of elements of each row in $G_{struct}$ after the processing of erasure and column permutation. As shown in FIG. 5, the method includes the following steps:

501: obtaining $R_e$ by filling a known bit sequence of the length of d=L−K in the corresponding positions of a received code word sequence $R_t$, and by deleting code word symbols erased by a channel;

wherein K is the length of original information bits, and L is the encoded length of the original information bits after filling.

Assuming that $X_T$ symbols: $\{r_i, r_j, \ldots, r_p \ldots r_x\}$ in $R_t = (r_0, r_1, \ldots r_{N+d-1})^T$ after filling a known bit sequence has been erased by a channel; wherein $X_L$ symbols $\{r_i, r_j, \ldots, r_p\}$ in the first L symbols have been erased by a channel; then Xset=$\{i, j, \ldots, p, \ldots, x\}$; $Xset_L = \{i, j, \ldots p\}$.

502: obtaining an erasure generator matrix $G_e$ by performing row erasing (deleting) processing to $G_{ldgct}$ according to how the received code word sequence $R_t$ has been erased;

assuming Xset=$\{i, j, \ldots, p, \ldots, x\}$; $Xset_L = \{i, j, \ldots p\}$, obtaining $G_e$, by erasing the $\{i, j, \ldots, p, \ldots, x\}$-th rows in $G_{ldgct}$ accordingly.

503: performing column permutation to the erasure generator matrix $G_e$, making M-order square matrix with (0, 0) as its vertex in $G_e$ to be a lower triangular matrix, and denoting the permuted matrix of $G_e$ as permutation generator matrix $G_a$; also recording corresponding relationship of column permutation between $G_e$ and $G_a$, which is used for performing inverse operation to $I_t'$ that is generated by the corresponding permutation operation performed to $I_t$ during the above-mentioned column permutation process.

Figure 6:
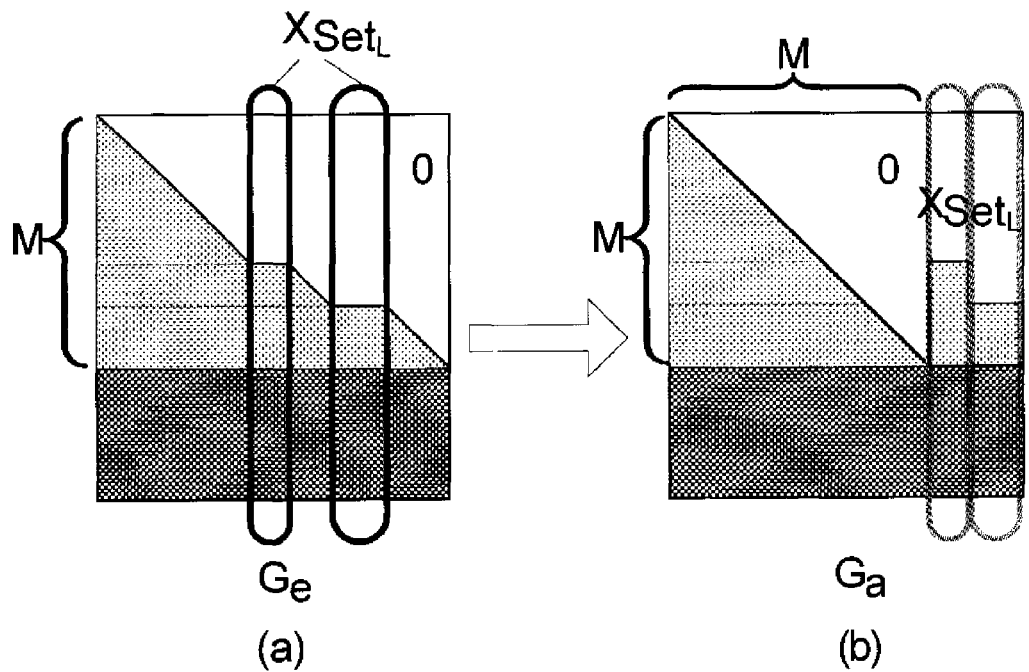
FIG. 6 is a schematic illustration of performing column permutation to the erasure generator matrix $G_e$.

FIG. 6 is an schematic illustration of performing column permutation to the erasure generator matrix $G_e$.

Specifically, in order to obtain a lower triangular matrix, columns of $G_e$ whose column serial numbers fall within $Xset_L$ are moved to the rightmost side of $G_e$, and subsequent columns whose column serial numbers do not fall within $Xset_L$ are sequentially filled in vacated positions of corresponding columns, then the permutation generator matrix is obtained:

$$G_a = \begin{bmatrix} A & C \\ D & B \end{bmatrix}.$$

Wherein matrix A is an M-order square matrix, all elements on its diagonal line are nonzero elements, and it has the characteristic of a strictly lower triangular matrix; matrix C is a matrix of the size of M×(L−M); matrix D is a matrix of (N−K−($X_T$−$X_L$))×M; matrix B is a matrix of (N−K−($X_T$−$X_L$))×(L−M), where M=L−$X_L$.

504: representing each row of B and C in $G_a$ by using WNum processor words;

because the length of each row of B and C is $Xset_L$, assuming that the processor word width is WWid, then $WNum=ceil(Xset_L/WWid)$.

If $Xset_L$ is not an integral multiple of WWid, the last processing word of each row contains the last mod($Xset_L$,WWid) elements of that row; and the rest Z=WWid−mod($Xset_L$,WWid) bits of that processing word can be cleared.

Therefore, B and C can be represented by using a two-dimensional array, respectively, and each element in the two-dimensional array is a processing word. The total number of elements of the two-dimensional array corresponding to matrix C is: M×WNum; the total number of elements of the two-dimensional array corresponding to matrix B is: (N−K−($X_T$−$X_L$))×WNum.

For example, the row length of B and C is $Xset_L$=200; assuming that the processor word width WWid=32, then WNum=ceil($Xset_L$/WWid)=ceil(200/32)=7; i.e. each row of B and C needs to be stored and represented with 7 processing words.

Because 200 is not an integral multiple of 32, mod($Xset_L$,WWid)=mod(200,32)=8, the last processing word contains 8 significant bits, the rest 32−8=24 bits of the processing word are insignificant, and they can be cleared.

Therefore, matrix C can be stored and represented by using a two-dimensional array with the total number of elements of M×7, and matrix B can be stored and represented by using a two-dimensional array with the total number of elements of (N−K−($X_T$−$X_L$))×7; compared to existing technologies where C is represented by using a two-dimensional array with the total number of elements of M×200, and B is represented by using a two-dimensional array with the total number of elements of (N−K−($X_T$−$X_L$))×200, a lot of storage space is saved.

It should be noted that because the nonzero elements in matrices A and D can be obtained through direct calculation by using a formula defined by a constructive generator matrix during encoding, A and D actually do not need to be stored, and during the process of elimination performed to A and D, the positions of the nonzero elements can be obtained through direct calculation by using the formula defined by the constructive generator matrix during encoding, and then "row addition" is performed according to the positions of these nonzero elements. Of course, the same method can also be used for storing and representing A and D. While B and C can be seen as random sparse matrices, therefore for the row addition operation performed to them, it is only allowed to add corresponding elements one by one. Row addition capability of software processing can be optimized to the best level by using one processing word to represent data structure of WWid elements.

505: obtaining an intermediate variable $I_t'$ by solving a system of equations $G_a \times I_t' = R_e$; and $I_t$ can simply be obtained by performing inverse permutation according to the permutation relationship from $I_t$ to $I_t'$ (i.e. the column permutation relationship from $G_e$ to $G_a$).

During the process of obtaining the intermediate variable $I_t$ by using the Gauss elimination method, the "row addition" operation involving matrices B and C is accomplished by using the XOR instructions of the processor; therefore a complete row addition operation can be replaced by an XOR operation of WNum processing words, which is equivalent to perform row addition operation in parallel with a degree of parallelism of WWid, thereby dramatically increasing the operation speed of "row addition" operation.

506: obtaining $s_t$ according to the relation of the system of equations $G_{ldgct}(0:L-1) \times I_t = s_t$, and obtaining an original information sequence m of K bits by deleting the filled d known bits from $s_t$, thereby completing LDGC decoding.

Figure 7:
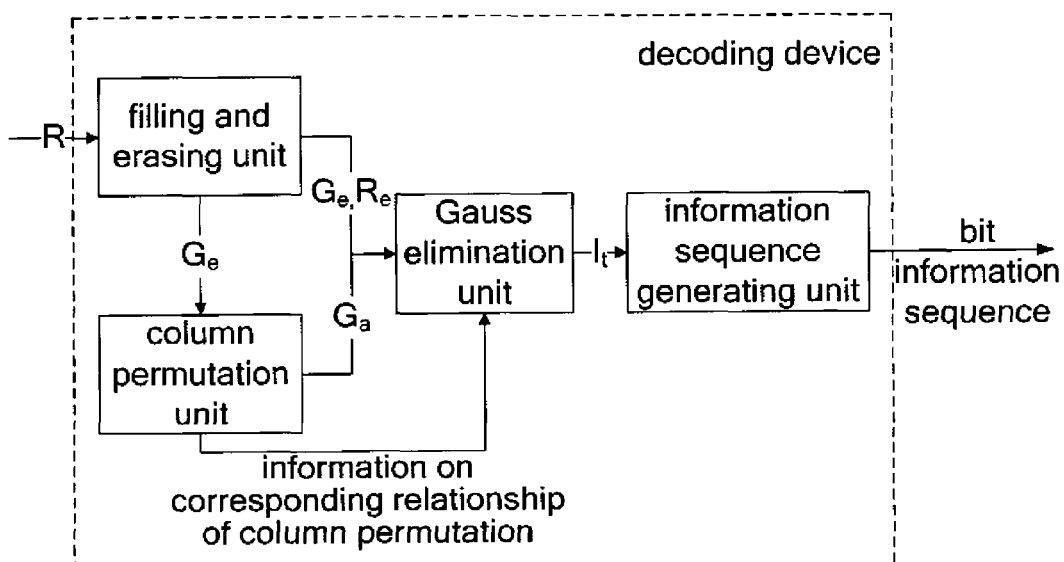
FIG. 7 is a schematic illustration of a decoding device for low density generator matrix codes according to an embodiment of the present disclosure.

FIG. 7 is a schematic illustration of a decoding device for low density generator matrix codes according to an embodiment of the present disclosure. As shown in FIG. 7, the device comprises: a filling and erasing unit, a column permutation unit, a Gauss elimination unit, and an information sequence generating unit.

The filling and erasing unit, is used for generating and outputting $R_e$ by filling d=L−K known bits in a received code word sequence R and by deleting code word symbols erased by a channel; and for generating and outputting $G_e$ by deleting rows corresponding to the code word symbols erased by a channel from a transposed matrix $G_{ldgct}$ of an LDGC generator matrix;

wherein for a structured and non-structured LDGC generator matrix, the filling and erasing unit uses WNum processing words to sequentially store all or part of matrix elements of each row in $G_e$, each processing word stores WWid matrix elements of $G_e$; WWid is the word width of a processing word, and WNum=ceil(Len/WWid). Len is the number of elements in a row that need to be represented by using processing words.

The column permutation unit, is used for performing column permutation to the $G_e$ outputted by the filling and erasing unit, making M-order square matrix A with elements of the 0-th row and the 0-th column as its vertex in $G_e$ to be a lower triangular matrix, generating and outputting $$G_a = \begin{bmatrix} A & C \\ D & B \end{bmatrix},$$

and outputting information on corresponding relationship of column permutation between $G_e$ and $G_a$;

M=L−$X_L$, where $X_L$ is the number of bits erased by a channel in the first L symbols of R.

The column permutation unit can move columns of $G_e$ whose column serial numbers fall within $Xset_L$ to the rightmost side of $G_e$, and sequentially fill subsequent columns whose column serial numbers do not fall within $Xset_L$ in vacated positions of corresponding columns, then obtain $G_a$. For a non-structured LDGC generator matrix, this unit is an optional unit.

The Gauss elimination unit, is used for obtaining and outputting $I_t$ by performing Gauss elimination to the $G_e$ outputted by the filling and erasing unit according to the relation $G_e \times I_t = R_e$; or obtaining $I_t'$ by performing Gauss elimination to the $G_a$ outputted by the column permutation unit according to the relation $G_a \times I_t' = R_e$, and obtaining and outputting $I_t$ by performing inverse permutation to $I_t'$ according to the information on corresponding relationship of column permutation outputted by the column permutation unit.

The information sequence generating unit, is used for receiving the $I_t$ outputted by the Gauss elimination unit; obtaining $s_t$ according to the relation $G_{ldgct}(0:L-1,0:L-1) \times I_t = s_t$, and outputting an original information sequence of K bits after deleting d known bits from $s_t$.

It is known from the above that for an LDGC generator matrix, the decoding method and device of the present disclosure can be used for accelerating processing speed of Gauss elimination.

Based on the fundamental principle of the present disclosure, the above-mentioned embodiments can also have many types of variations:

For an LDGC generator matrix of another shape, for example, when the first L rows form an upper triangular matrix, the decoding method of the present disclosure can be used after transforming it into a lower triangular matrix.

The invention claimed is:

1. A decoding method for low density generator matrix codes that decodes a received bit information sequence that is transmitted after encoding with LDGC, wherein the decoding method is implemented at a decoder, the decoding method comprising:

S1: filling L-K known bits in a received code word sequence R and deleting code word symbols erased by a channel in R, and getting $R_e$, wherein K is the length of original information bits, L is the length of the information bits after filling;

S2: deleting rows corresponding to the code word symbols erased by a channel from a transposed matrix $G_{ldgct}$ of an LDGC generator matrix, and getting $G_e$; wherein using WNum processing words to sequentially store all or part of same-position matrix elements of each row in $G_e$, and each processing word is used for storing WWid matrix elements of $G_e$;

S3: obtaining $I_t$ according to relation $G_e \times I_t = R_e$;

S4: obtaining $s_t$ according to relation $G_{ldgct}(0:L-1,0:L-1) \times I_t = s_t$, and getting an original information sequence of K bits by deleting the filled L-K known bits from $s_t$;

the $G_{ldgct}$ is a GF(2) field matrix of N+L-K rows and L columns, WWid is the word width of the processing word, WNum=ceil(P/WWid), and P is the number of matrix elements of each row in $G_e$ that are stored by using one bit of the processing word.

2. The method according to claim 1, wherein in step S3, the $I_t$ is obtained by using Gauss elimination method; and during the Gauss elimination process, for the matrix elements of each row in $G_e$ that are stored by using one bit of the processing word, row addition of corresponding rows is accomplished by performing XOR operation to the processing words corresponding to two rows in $G_e$.

3. The method according to claim 1, wherein a square matrix corresponding to the first L rows in the $G_{ldgct}$ is a lower triangular matrix; step S3 includes the following substeps:

S31: generating $$G_a = \begin{bmatrix} A & C \\ D & B \end{bmatrix}$$

by performing column permutation to $G_e$, wherein A is an M-order lower triangular matrix, and recording corresponding relationship of column permutation between $G_e$ and $G_a$;

S32: obtaining $I_t'$ according to relation $G_a \times I_t' = R_e$, and getting $I_t$ by performing inverse permutation to $I_t'$ according to the corresponding relationship of column permutation; wherein the processing words are used for sequentially storing all matrix elements of each row in C and B, and each bit of each processing word is used for sequentially storing WWid matrix elements of C and B.

4. The method according to claim 3, wherein the $M=L-X_L$, where $X_L$ is the number of bits erased by a channel in the first L code word symbols of R.

5. The method according to claim 3, wherein assuming that $Xset_L$ is a set of serial numbers of erased code word symbols in the first L code word symbols of R after filling the L-K known bits, and the number of serial numbers in the set is $X_L$;

in step S31, columns of $G_e$ whose column serial numbers fall within $Xset_L$ are moved to the rightmost side of $G_e$, and subsequent columns whose column serial numbers do not fall within $Xset_L$ are sequentially filled in vacated positions of corresponding columns, and the $G_a$ is obtained.

6. A decoding device for low density generator matrix codes, comprising: a filling and erasing unit, a Gauss elimination unit, and an information sequence generating unit, wherein the filling and erasing unit, is used for generating and outputting $R_e$ by filling L-K known bits in a received code word sequence R and by deleting code word symbols erased by a channel; and for generating and outputting $G_e$ by deleting rows corresponding to the code word symbols erased by a channel from a transposed matrix $G_{ldgct}$ of an LDGC generator matrix;

wherein WNum processing words are used for sequentially storing all or part of same-position matrix elements of each row in $G_e$, and each processing word stores WWid matrix elements of $G_e$;

the Gauss elimination unit, is used for obtaining and outputting $I_t$ by performing Gauss elimination to $G_e$ according to relation $G_e \times I_t = R_e$;

the information sequence generating unit, is used for receiving the $I_t$ outputted by the Gauss elimination unit; obtaining $s_t$ according to relation $G_{ldgct}(0:L-1,0:L-1) \times I_t = s_t$, and outputting an original information sequence of K bits after deleting the L-K known bits from $s_t$; the $G_{ldgct}$ is a GF(2) field matrix of N+L-K rows and L columns, WWid is the word width of the processing word, WNum=ceil(P/WWid), and P is the number of matrix elements of each row in $G_e$ that are stored by using one bit of the processing word;

wherein K is the length of original information bits, L is the length of the information bits after filling.

7. The device according to claim 6, wherein the Gauss elimination unit obtains the $I_t$ by using Gauss elimination method; and during the Gauss elimination process, for the matrix elements of each row in $G_e$ that are stored by using one bit of the processing word, accomplishes row addition of corresponding rows by performing XOR operation to the processing words corresponding to two rows in $G_e$.

8. The device according to claim 6, wherein
a square matrix corresponding to the first L rows in the $G_{ldgct}$ is a lower triangular matrix;
the device further comprising a column permutation unit, which is used for generating $$G_a = \begin{bmatrix} A & C \\ D & B \end{bmatrix}$$

by performing column permutation to $G_e$ outputted by the filling and erasing unit, wherein A is an M-order lower triangular matrix, and for outputting information on corresponding relationship of column permutation between $G_e$ and $G_a$;
the Gauss elimination unit obtains $I_t'$ according to relation $G_a \times I_t' = R_e$ and obtains and outputs $I_t$ by performing inverse permutation to $I_t'$ according to the information on the corresponding relationship of column permutation outputted by the column permutation unit;
wherein the processing words are used for sequentially storing all matrix elements of each row in C and B, and each bit of each processing word is used for sequentially storing WWid matrix elements of C and B.

9. The device according to claim 8, wherein
the M=L−$X_L$, where $X_L$ is the number of bits erased by a channel in the first L code word symbols of R.

10. The device according to claim 8, wherein
assuming that $Xset_L$ is a set of serial numbers of erased code word symbols in the first L code word symbols of R after filling the L−K known bits, and the number of serial numbers in the set is $X_L$;
the column permutation unit moves columns of the $G_e$ whose column serial numbers fall within $Xset_L$ to the rightmost side of $G_e$, and sequentially fills subsequent columns whose column serial numbers do not fall within $Xset_L$ in vacated positions of corresponding columns, and obtains the $G_a$.

* * * * *

UNITED STATES PATENT AND TRADEMARK OFFICE
CERTIFICATE OF CORRECTION

PATENT NO.        : 8,438,448 B2                                                                 Page 1 of 1
APPLICATION NO. : 12/991628
DATED             : May 7, 2013
INVENTOR(S)       : Yuan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 238 days.

Signed and Sealed this
Eighth Day of September, 2015

Michelle K. Lee
*Director of the United States Patent and Trademark Office*